US010223495B1

(12) United States Patent
Agrawal et al.

(10) Patent No.: US 10,223,495 B1
(45) Date of Patent: Mar. 5, 2019

(54) SYSTEM AND METHOD FOR TUNING A GRAPHICAL HIGHLIGHT SET TO IMPROVE HIERARCHICAL LAYOUT AWARENESS AND EDITING

(71) Applicant: Cadence Design Systems, Inc., San Jose, CA (US)

(72) Inventors: Sunil Agrawal, Noida (IN); Devendra Deshpande, Noida (IN)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 103 days.

(21) Appl. No.: 15/382,593

(22) Filed: Dec. 16, 2016

(51) Int. Cl.
*G06F 17/50* (2006.01)
*G06F 15/04* (2006.01)

(52) U.S. Cl.
CPC .............. *G06F 17/5081* (2013.01)

(58) Field of Classification Search
USPC .................................. 716/115, 139
See application file for complete search history.

(56) References Cited

U.S. PATENT DOCUMENTS

| 7,810,063 | B1 | 10/2010 | Sharma et al. |
| 7,917,877 | B2 | 3/2011 | Singh et al. |
| 8,046,730 | B1 | 10/2011 | Ferguson et al. |
| 8,255,845 | B2 | 8/2012 | Ginetti |
| 8,640,080 | B1 | 1/2014 | Salowe et al. |
| 2011/0131544 | A1* | 6/2011 | Majumder .......... G06F 17/5086 716/139 |
| 2012/0023471 | A1* | 1/2012 | Fischer ............... G06F 17/5068 716/115 |

* cited by examiner

*Primary Examiner* — Brian Ngo
(74) *Attorney, Agent, or Firm* — Foley & Lardner LLP (57) ABSTRACT

The present embodiments relate generally to integrated circuit design, and more particularly to techniques for providing enhanced visual information about a shape of interest in a hierarchical design. For example, embodiments relate to automatically and dynamically creating or adjust a highlight set in a graphical user interface for providing hierarchical information about shapes in a hierarchical design in a more productive manner, and possibly concurrently with other textual information about shapes that is being displayed. In these and other embodiments, these automatic and/or dynamic highlight sets can be based on the relationship between a current cursor position and shapes of a hierarchical design that is currently being edited using a GUI of a layout editor tool that is adapted with the functionality of the present disclosure.

20 Claims, 9 Drawing Sheets

FIG. 1

PreSel: CellName(Level2) | Rect Layer(Poly drw) Width(2.9850) Height(1.7700)

SYSTEM AND METHOD FOR TUNING A GRAPHICAL HIGHLIGHT SET TO IMPROVE HIERARCHICAL LAYOUT AWARENESS AND EDITING

TECHNICAL FIELD

The present disclosure relates generally to integrated circuits and more particularly to techniques for tuning highlight sets in a graphical user interface for performing hierarchical layout editing of integrated circuit designs.

BACKGROUND

Conventional integrated circuits can comprise billions of devices on many different layers. Custom and other designs of integrated circuits can be created using electronic design automation (EDA) technologies that typically run on an operating system in conjunction with a microprocessor-based computer system or other programmable control system. Conventional EDA systems or tools typically generate a layout of shapes corresponding to circuit elements (e.g., gates, transistors, etc.) for each of the different layers. In many design applications, the EDA software can further include functionality that allows a user to implement "cells" as a basic element of functionality through a layout editor implemented on a graphical user interface (GUI). A given cell may be placed, or "instanced," many times in a layout design to accelerate the design process.

A hierarchical design is an electronic circuit design having a collection of different levels (e.g., level 0, 1, 2, . . . , n), wherein each higher level hides the details and shapes of the lower levels to simplify the design process. That is, a design hierarchy allows the circuit design to be broken down into a collection of smaller designs (or levels), thus reducing visual complexity of the design process, and enabling the EDA system to work with a collection of smaller design files so the design tools can run faster.

Using a GUI, a designer can issue commands to the EDA tool for various purposes such as to obtain information about or visualize the current layout design. Circuit designers generally create a design and reuse this design by placing an instance of the cellview inside another design and this way a level of hierarchy can be created. Many EDA tools (e.g., layout editor tools) support conventional controls such as "Information Balloons" and "Show Selection Info" that display textual information about an existing object or a shape underneath the mouse cursor. Although this textual information is helpful, there are many situations where problems with the displayed information can arise that decrease or limit user productivity, for example in very dense designs. Moreover, this textual information does not always effectively convey hierarchy information, which would be useful for making decisions for further editing commands.

SUMMARY

The present embodiments relate generally to integrated circuit design, and more particularly to techniques for providing enhanced visual information about a shape of interest in a hierarchical design. For example, embodiments relate to automatically and dynamically creating or adjust a highlight set in a graphical user interface for providing hierarchical information about shapes in a hierarchical design in a more productive manner, and possibly concurrently with other textual information about shapes that is being displayed. In these and other embodiments, these automatic and/or dynamic highlight sets can be based on the relationship between a current cursor position and shapes of a hierarchical design that is currently being edited using a GUI of a layout editor tool that is adapted with the functionality of the present disclosure.

BRIEF DESCRIPTION OF THE DRAWINGS

These and other aspects and features of the present embodiments will become apparent to those ordinarily skilled in the art upon review of the following description of specific embodiments in conjunction with the accompanying figures, wherein.

DETAILED DESCRIPTION OF THE PREFERRED EMBODIMENTS

The present embodiments will now be described in detail with reference to the drawings, which are provided as illustrative examples of the embodiments so as to enable those skilled in the art to practice the invention. Notably, the figures and examples below are not meant to limit the scope of the present embodiments to a single embodiment, but other embodiments are possible by way of interchange of some or all of the described or illustrated elements. Moreover, where certain elements of the present embodiments can be partially or fully implemented using known components, only those portions of such known components that are necessary for an understanding of the present embodiments will be described, and detailed descriptions of other portions of such known components will be omitted so as not to obscure the present embodiments. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the present disclosure is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present embodiments encompass present and future known equivalents to the known components referred to herein by way of illustration.

According to certain general aspects, the present embodiments relate to techniques that provides enhanced visual information about a shape of interest in a hierarchical design. For example, embodiments relate to automatically and dynamically creating or adjust a highlight set in a graphical user interface for providing hierarchical information about shapes in a hierarchical design in a more productive manner, and possibly concurrently with other textual information about shapes that is being displayed. In these and other embodiments, these automatic and/or dynamic highlight sets can be based on the relationship between a current cursor position and shapes of a hierarchical design that is currently being edited using a GUI of a layout editor tool that is adapted with the functionality of the present disclosure. Although the descriptions below will relate to tuning preferred highlight parameters such as highlight color, width and line type, the embodiments are not limited to these parameters and can include other audiovisual indicators and parameters.

Figure 1:
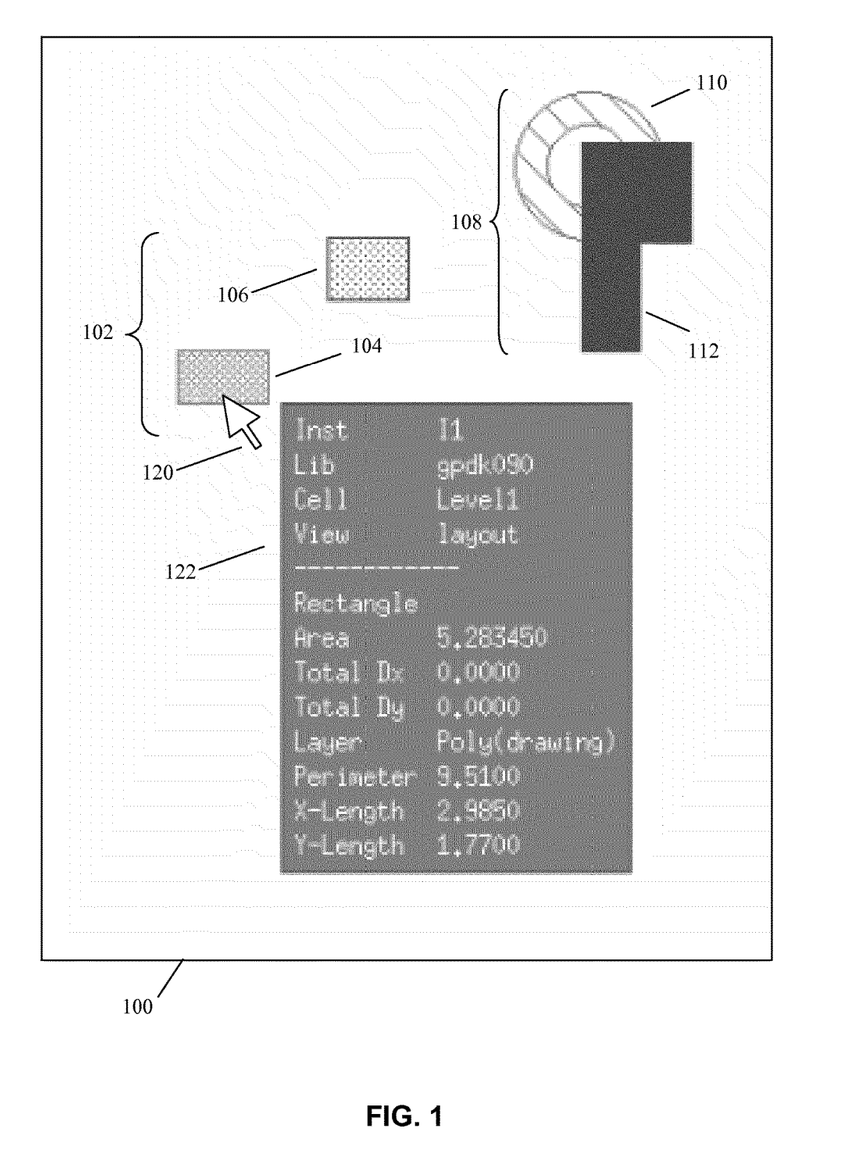
FIGS. 1 and 2 are diagrams illustrating aspects of problems arising from conventional user interface approaches to providing information about shapes of interest in a hierarchical integrated circuit design.
Figure 2:
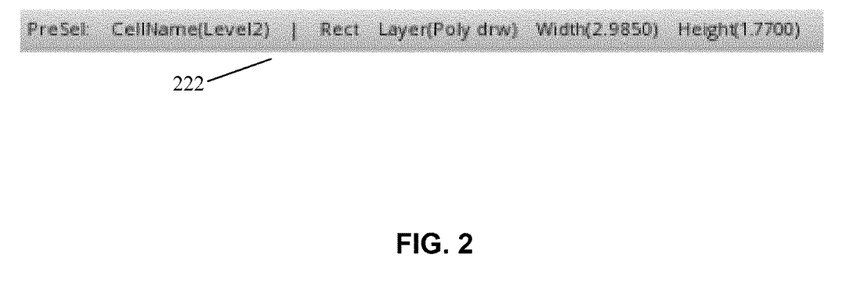

According to certain additional aspects, the present applicants recognize several drawbacks to conventional approaches, examples of which are illustrated in FIGS. 1 and 2.

One problem with conventional approaches is that they do not give users any visual clues as to an object's association with other objects or hierarchy information. For example, FIG. 1 is a view 100 representing a conventional GUI display of a portion of an integrated circuit design layout.

In this example, view 100 displays a two-level hierarchy of two different instances 102 and 108. Instance 102 contains two rectangles 104 and 106 and instance 108 contains a donut shape 110, a polygon shape 112 and instance 102. It should be noted that a GUI display for an EDA tool or similar environment can include many other elements not shown in FIG. 1 such as several different windows or views related to a design, toolbars, menus, etc.

When a user hovers a cursor 120 on rectangle 104 (e.g. using a mouse, touchpad or similar peripheral device), a pop-up box 122 containing textual information is displayed as shown. As shown in this example, this textual information includes identification information about the shape, as well as dimension and location information about the shape. However, there is no display of any visual clue to the user about which objects this textual information belongs to, perhaps apart from the cursor. This could be a problem when the view 100 includes many partial or fully overlapping shapes, such as may occur in dense designs or at high zoom levels. There is also no display of any information about hierarchy.

It should be noted that pop-up box 122 is just one example of a textual display that can be presented in connection with a particular shape. For example, some EDA tools provide pre-selection information 222 as shown in FIG. 2 on cursor hover, such as in a predefined location of the toolbar, which can be enabled or disabled by the user. However, as with box 122, this information does not help the user in building the understanding about the hierarchical layout design through visual inspection.

Example aspects of the present embodiments for addressing the above and other problems are illustrated in FIGS. 3 to 6.

Figure 3:
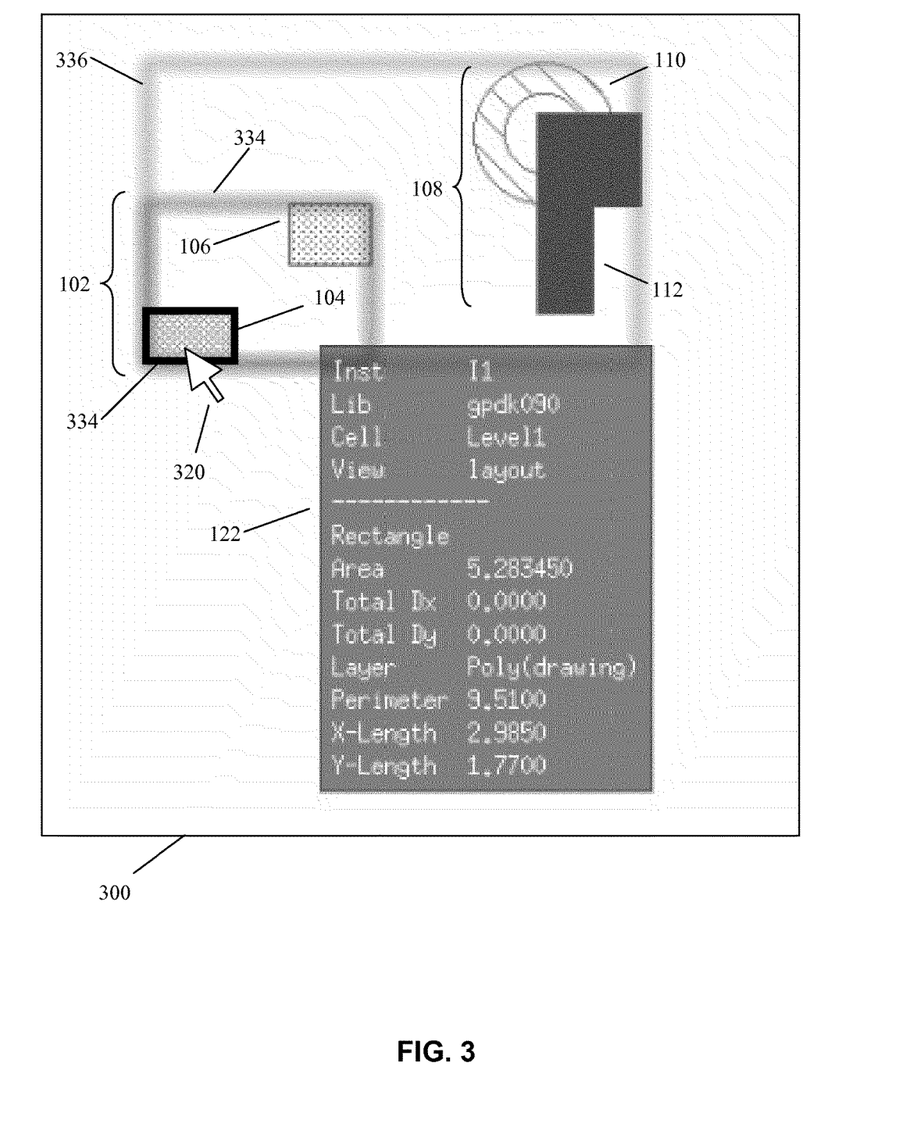
FIGS. 3 to 6 are diagrams illustrating aspects of solutions to the problems illustrated in FIGS. 1 and 2, according to the present embodiments.

In connection with the problems described above in FIG. 1, among others, instead of just providing textual information about a shape, embodiments of the invention highlight the shape, as well as other shapes in a hierarchy based on viewable hierarchy levels or user selection. For example, FIG. 3 is a view 300 representing an example GUI display according to the present embodiments. As in FIG. 1, this example display contains two different instances 102, 108. However, according to aspects of the present embodiments a graphical highlight 334 appears around the object 104 in addition to the textual information being displayed in box 122 when the cursor 120 is being hovered over it. Moreover, highlights 334 and 336 are displayed around both instances 102 and 108 (because instance 102 belongs to instance 108), based on all hierarchical levels for the viewable area. As both shapes and instances get highlighted, the display in view 300 gives better information about the hierarchy path of the design than the display in view 100. Moreover, the textual information in box 122 becomes easier to correlate with the shapes displayed and more beneficial.

Figure 4:
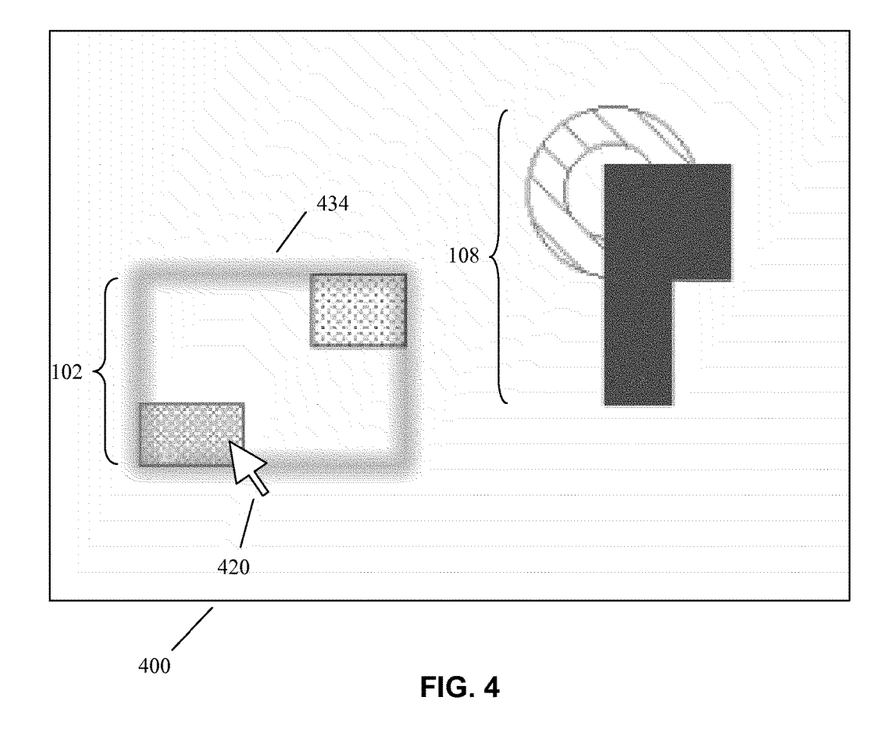

In the example of FIG. 3, both the levels associated with instances 102 and 108 were highlighted automatically because they both were within the viewable area. In other embodiments, a user may set the number of levels of hierarchy to be highlighted dynamically through user control. For instance, user may choose to highlight only one hierarchical level, in which case only instance 102 is highlighted with highlight 434 as shown in FIG. 4 when cursor 420 is hovered over object 104. In this case, because the other instance 108 is at another level, it is not highlighted as in the example of FIG. 3.

Figure 5:
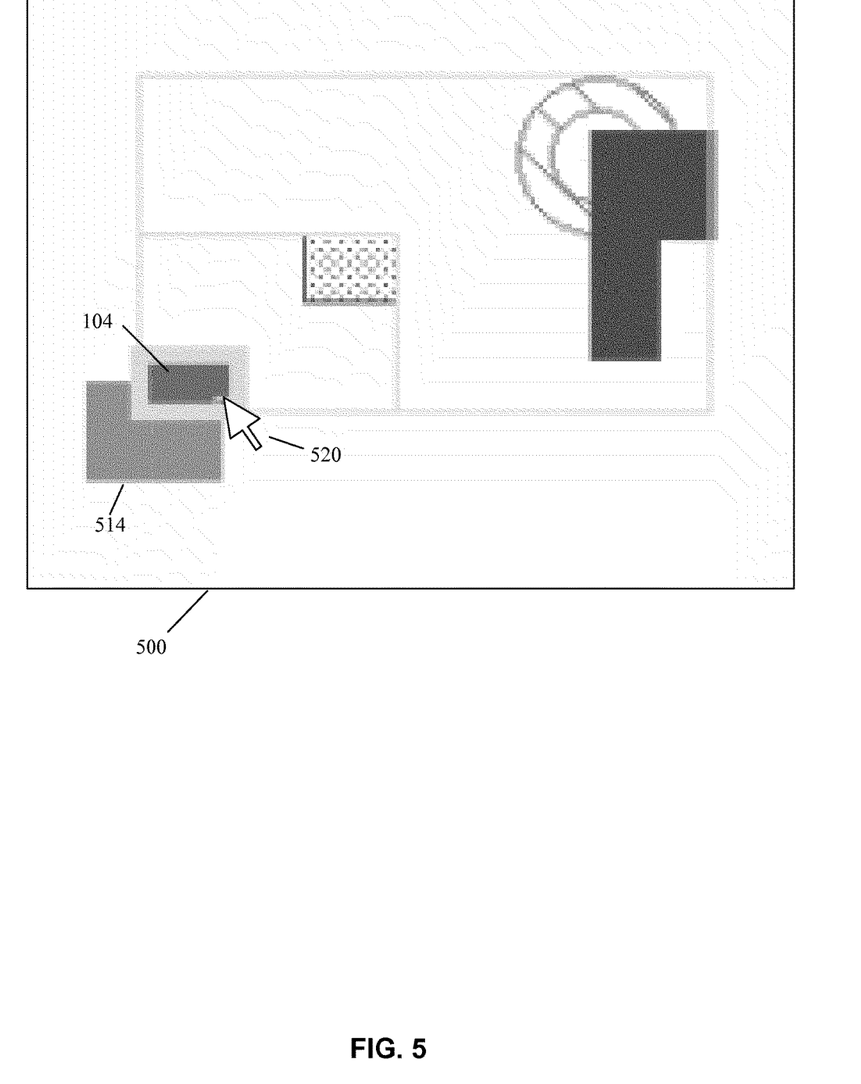

According to certain additional aspects of embodiments, instead of a static highlight color being used, the highlight set color is tuned based on the cursor position. For example, FIG. 5 is a view 500 representing an example GUI display according to the present embodiments. As in FIG. 3, shapes 102 and 104 are displayed, and a user hovers a cursor 520 over shape 102. According to the present embodiments, based on the cursor position, the highlight color is changed, either automatically or by user control. More particularly, according to the present embodiments, based on the zoom level and based on the color of object, the highlight set will adjust automatically to make the highlight set visible to the user. For instance, the highlight color of highlight 532 is changed to a light color to contrast with the dark color of shape 102 (as well as perhaps other overlapping shapes such as shape 514) and its width is increased based on the zoom level. In embodiments, the user is able to dynamically adjust the highlight set through user control as well.

An additional problem with conventional approaches relates to the concept of figgroup in a custom layout. In general, a figgroup is a group of shapes and/or instances. More particularly, some example EDA tools allow such groups to be created to allow the user to manipulate the specified objects as a whole, rather than individually. So when the group is moved (or copied, deleted, etc.), all the objects in the group are moved (or copied, deleted, etc.). Objects can be added and removed from the figgroup as deemed necessary or desirable by the user. As such, defining figgroups is similar to creating another virtual level of hierarchy without creating an instance or master. But figgroups are different from instances. For example, if there are two rectangle shapes at level 0, and if a cell is created including these two rectangles, then an instance will be created at level 1. Meanwhile if a figgroup is created with these two rectangles, the figgroup will be created at level 0 only. Also, a figgroup cannot be instantiated (or placed) like a cell. In these example EDA tools, when highlighting a shape, no information is provided regarding whether the shape is part of an instance or a figgroup.

Figure 6:
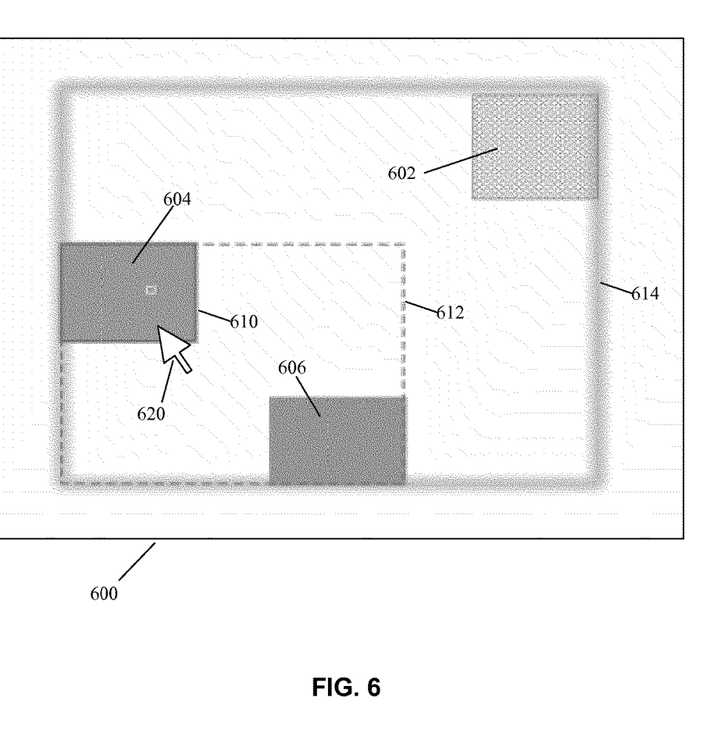

In accordance with additional aspects, in the present embodiments the figgroup is highlighted with a distinct highlight set to give a clear indication to the user that the shape is part of the figgroup. For example, FIG. 6 is a view 600 representing an example GUI display according to the present embodiments. In this example, shapes 604 and 606 are part of the same figgroup, and all shapes 602, 604 and 606 are part of the same instance. When a user hovers cursor 620 over figgroup shape 604, a figgroup highlight 612 is displayed around shapes 604 and 606 in addition to shape highlight 610. According to additional aspects, the figgroup highlight 612 is different (e.g., dotted lines) than an instance highlight 614 (e.g. solid line) to clearly indicate that shape 604 is part of a figgroup that is different from the instance. These clear visual distinctions between figgroup and the instance allows the user to build an understanding of the hierarchical layout design and helps the user perform further editing operations in a more productive manner.

Figure 7:
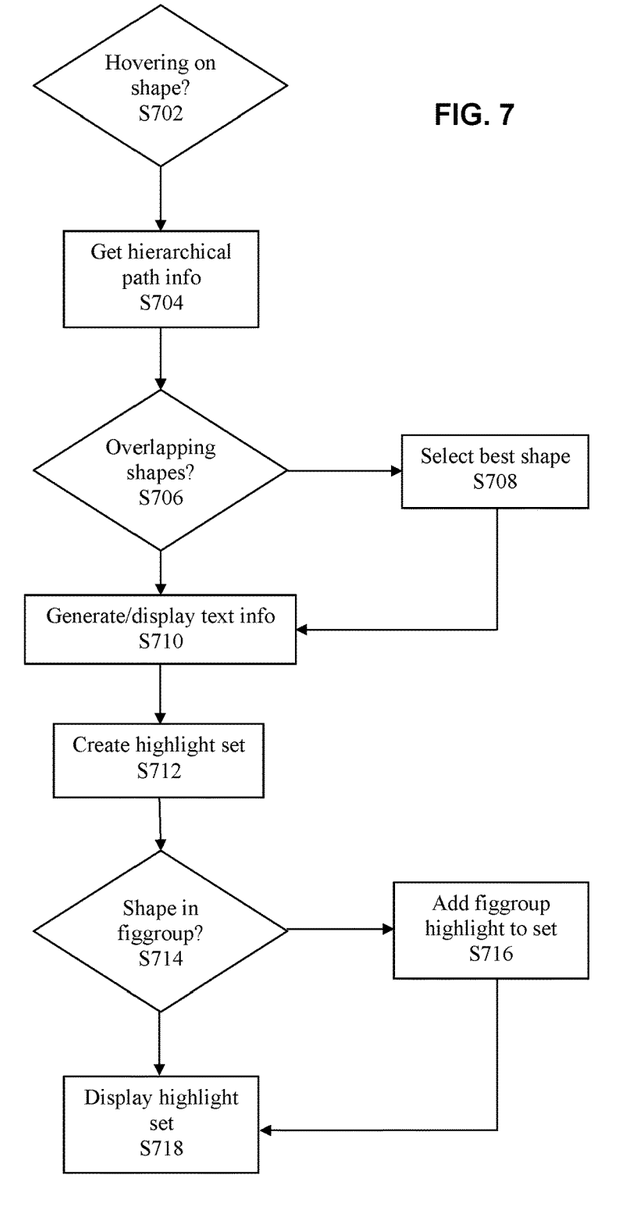
FIG. 7 is a flowchart illustrating an example methodology for creating visual cues about shapes of interest such as automatically tuned highlight sets according to the present embodiments.

FIG. 7 is a flowchart illustrating an example methodology for implementing these and other solutions for editing a hierarchical design according to embodiments.

In a first step S702, the current cursor position in the GUI is monitored until the cursor is hovering over a shape in a portion of the layout that is currently being displayed for editing. Those skilled in the art of user interfaces understand various ways to monitor a cursor position in a GUI and to detect a hover (e.g., the cursor remaining motionless for a threshold amount of time such as 2-3 seconds). These ways can depend on the operating system and/or the application software being used, and further details thereof will be omitted here for sake of clarity of the invention. Those skilled in the art of layout editors further understand that there are various ways to determine what shapes are being displayed, their visual boundaries, locations and colors in the display, and how to determine whether a cursor is located over a shape or shapes. Accordingly, further details thereof are not necessary for an understanding of the present invention and so will be omitted.

In step S704, the hierarchical path information is obtained for the shape or shapes being hovered over or otherwise being queried about. This information can include the current hierarchical level being displayed, information regarding other levels, information regarding an instance to which the shape belongs, other shapes included in the instance and their hierarchical levels, etc. It should be noted that this obtained information is in addition to other standard information for the shape or shapes that are being maintained by the user interface to generate the display of shapes, such as locations, boundaries, colors, etc.

In step S706, it is checked whether more than one shape underneath the cursor was obtained in step S702. If not, processing advances to step S710. Otherwise, in step S708, the best shape is selected. For example, multiple parameters can be used in combination to determine the best shape, such as which shape is overall closest to the cursor, which shape is included in the current object of precedence, which shape is included in the current layer of precedence, etc. It should be noted that, although shown separately in FIG. 7 for illustrating example aspects of the embodiments, steps S702 to S708 can be performed separately or in combination in various ways. For example, an EDA tool can include a single query based on the current position that automatically determines the best shape underneath a cursor and simply returns the path information for that particular shape.

For the selected or best shape, first in step 710, textual information about the shape is generated and displayed, for example using the objects such as 122 and 222 in FIGS. 1 and 2 as described above. The information about the shape is obtained by, for example, a point query as is known in the art.

In step S712 a highlight set is created for this shape and its hierarchical levels. For example, based on the hierarchical information for this shape, this step includes, for each hierarchical level, creating a highlight set and enabling the created highlight set for display. The number of levels to be highlighted could be decided based on the viewable hierarchy level for this cursor position. For example, if there is a three level hierarchy and the current viewable layout area only shows two levels, then a shape highlight, a first level highlight around all the shapes in the same instance and hierarchy level (e.g., a line in the shape of a rectangle enclosing all of the shapes) and a second level highlight around all the shapes in the same instance and hierarchy level (a total of three highlights) would be created.

In accordance with additional aspects described above, step S710 can include determining the shape color information and adapting the shape highlight color if needed so that one can distinguish between the shape color and the highlight color. Those skilled in the art of user interfaces will understand how to determine a highlight color that is sufficiently different from the shape color to a human eye, and so further details thereof will be omitted here for sake of clarity of the invention.

In similar accordance with additional aspects described above, step S710 can include determining the proximity and/or number of other shapes surrounding the current shape and adapting the shape highlight width if needed so that one can distinguish the shape from the surrounding shapes. Those skilled in the art of user interfaces will understand how to determine a highlight width that is sufficiently distinctive to a human eye, and so further details thereof will be omitted here for sake of clarity of the invention.

In step S712, it is determined whether the shape belongs to a figgroup, perhaps as defined by a user as described above. If so, in step S716, a highlight around all the displayed shapes of the fig group is created with a distinct characteristic to distinguish from instance highlights (e.g., dotted lines as opposed to a solid line for instance highlights) to give a clear indication to the user that the shapes are all part of a fig group as opposed to an instance.

In step S714, the generated highlight set is displayed in the GUI, which can have aspects described above in connection with the highlights shown in FIGS. 3 to 7.

It should be noted that, based on the information obtained in step S704 for all possible overlapping shapes, if the highlighted shape is not the one user wants, the GUI can allow the user to toggle to a different shape by pressing a space bar key, for example. In such a case, processing could return to step S710 and a different highlight set could be created and displayed for that shape accordingly.

Figure 8:
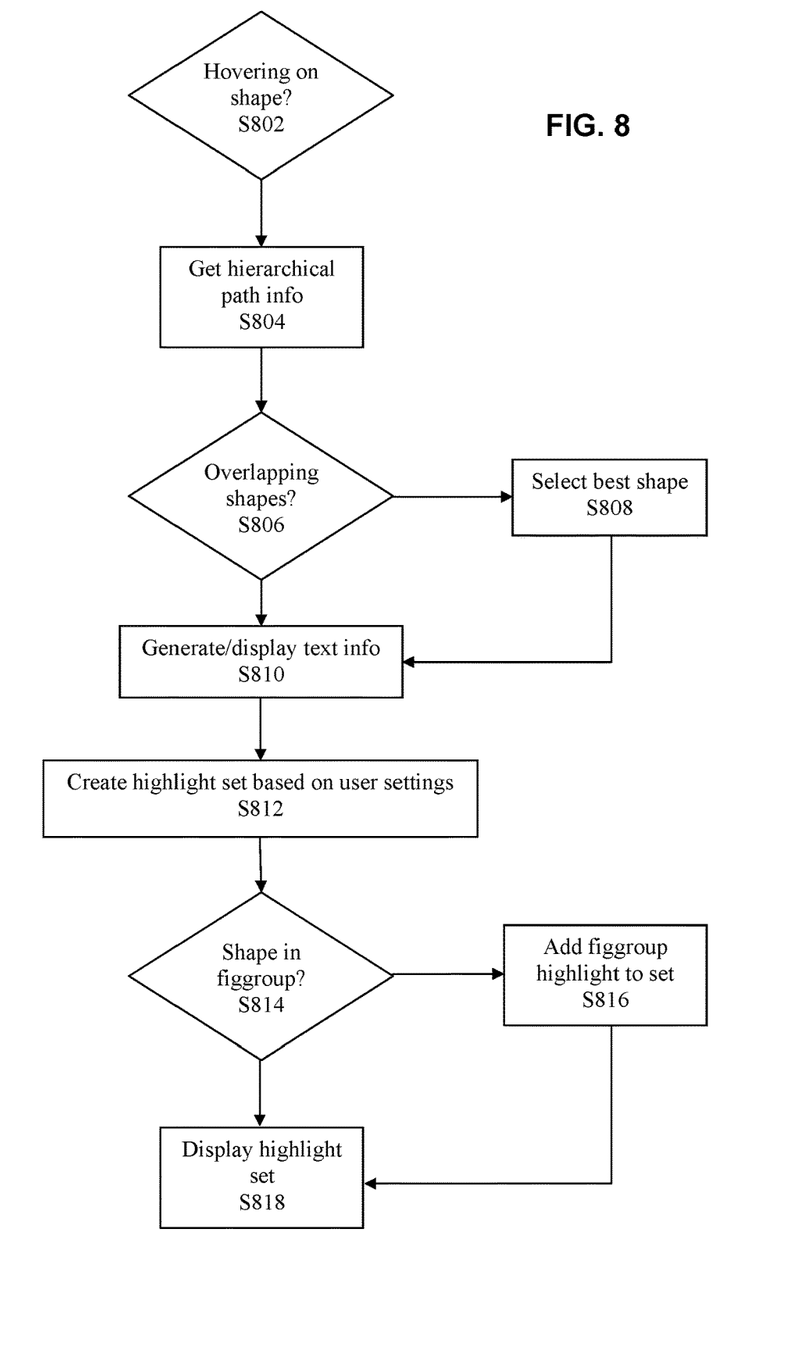
FIG. 8 is a flowchart illustrating an example methodology for creating visual cues about shapes of interest such as dynamically tuned highlight sets according to the present embodiments.

FIG. 8 is a flowchart illustrating another example methodology for implementing the above and other solutions for editing a hierarchical design according to embodiments.

In a first step S802, the current cursor position in the GUI is monitored until the cursor is hovering over a shape or shapes in a portion of the layout that is currently being displayed for editing. This can be performed similarly as described above in connection with step S702.

In step S804, the hierarchical path information is determined for the detected shape or shapes. This information and the way it is obtained can be similar to that described in step S704 above.

In step S806, it is determined if there more than one shape was detected in step S802. If not, processing advances to step S810. Otherwise, in step S808, the best one of the shapes is selected. This can be done similarly as described above in connection with step S708.

For the selected or best shape, first in step 810, textual information about the shape is generated and displayed, for example using the objects such as 122 and 222 in FIGS. 1 and 2 as described above. This can be done similarly as described above in connection with step S710.

In step S810 a highlight set is created for this shape and its hierarchical levels. For example, similar to step S710, based on the hierarchical information for this shape, this step includes, for each hierarchical level, creating a highlight set and enabling the created highlight set for display. However, differently from the methodology shown in FIG. 7, step S810 can further include creating the highlight set based on user settings for such parameters as highlight color, transparency and width. These settings can be configurable by the user using various user interface mechanisms known to those skilled in the art, such as drop-down menus, pop-up menus, dialog boxes, etc. Additionally or alternatively, these settings can be configured through environment variables or other various ways known to those skilled in the art.

The number of levels to be highlighted could also be decided based on user settings that are configured as described above. For example, if there is a three level hierarchy and the user only wants to see two levels as selected as described above, then a shape highlight, a first level highlight around all the shapes in the same instance and hierarchy level (e.g., a line in the shape of a rectangle enclosing all of the shapes) and a second level highlight around all the shapes in the same instance and hierarchy level (a total of three highlights) would be created.

In accordance with additional aspects described above, step S810 can include dynamically allowing the user to set the highlight color and/or the highlight width.

In step S812, it is determined whether the shape belongs to a fig group, which can be done similarly to that described in S712 above. If so, in step S814, a highlight around all the displayed shapes of the fig group is created as described above.

In step S816, the generated highlight set is displayed in the GUI.

Similar to the method shown in FIG. 7, it should be noted that, based on the information obtained in step S804 for all possible overlapping shapes, if the highlighted shape is not the one user wants, the GUI can allow the user to toggle to a different shape by pressing a space bar key, for example. In such a case, processing could return to step S810 and a different highlight set could be created and displayed for that shape accordingly.

It should be further noted that the methodologies of FIGS. 7 and 8 are not necessarily exclusive, and embodiments can include any combination of steps described above, and the order of their execution may be changed.

Figure 9:
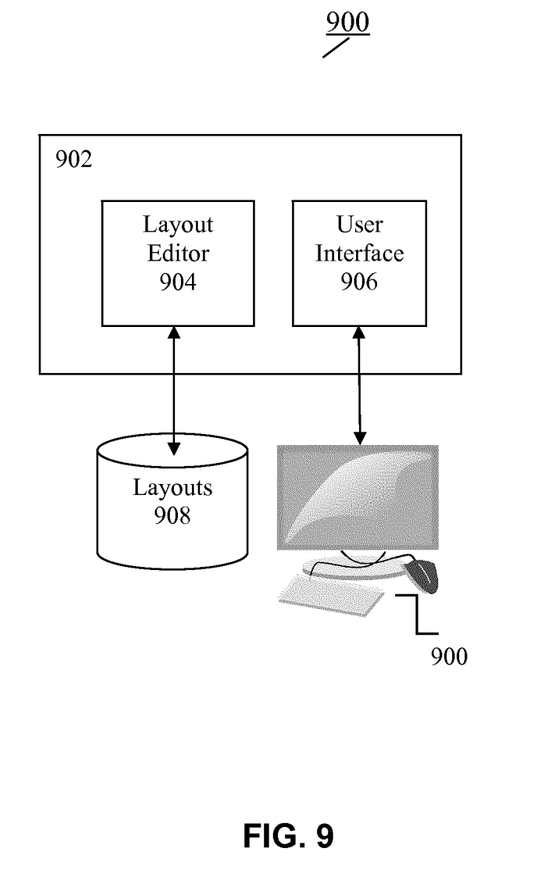
FIG. 9 is a block diagram illustrating an example system according to the present embodiments.

FIG. 9 is a block diagram of an example system according to the present embodiments.

As shown, the system includes an EDA tool 902 including a layout editor 904 and user interface module 906 that have been adapted with the tuned highlight set functionality of the present invention. It should be noted that the principles of the present embodiments are not limited to layout editor tools, and those skilled in the art will understand how to extend these principles to other types of EDA tools after being taught by the present examples.

In these and other embodiments, EDA tool 902 may include additional interactive or automated modules for interactively implementing physical electronic designs that are not shown such as a placer, a routing engine, a design rule checker, a verification engine, or a floorplanner, etc. as will be appreciated by those skilled in the art. In other embodiments, EDA tool 902 is a standalone application that only includes layout editor functionality and/or is adapted to communicate with other automated EDA modules.

In embodiments, system 900 can be implemented by one or more general purpose computers that are loaded with an operating system executing software and/or customized to include hardware for interactively implementing physical electronic designs and adapted with the tuned highlight set functionality of the present disclosure. In some embodiments, the one or more computing systems comprise various components not shown such as the processor(s) or processor core(s), memory, disks, etc. The one or more computing systems may further write to and read from a local or remote volatile or non-volatile computer accessible storage not shown that stores thereon data or information such as, but not limited to, one or more databases such as schematic design database(s) or physical design database(s), libraries, data, rule decks, constraints, etc. and/or other information or data that may be required to support the methodology of the present embodiments. In some embodiments, the one or more computing systems are implemented in a "cloud" configuration and/or a client/server configuration. For example, one or more server computers may be loaded with application software (e.g., a layout editor tool) for implementing some or all of the methodology of the present embodiments, and one or more client computers can communicate with the server computer(s) via a network to perform some or all of the methodology of the embodiments for a particular design.

In operation, a user can interact with layout editor tool 904 via user interface module 906 to create or edit highlight set parameters such as color and width as described above. In addition, when layout editor 904 is being used to create or modify a portion of a layout stored in layouts 908, using the methodology described above, for example, in response to user actions conducted using interface devices 910 (e.g., mouse, trackball, touchpad, touchscreen, etc.) and user interface 906, layout editor 904 creates tuned highlight sets and displays them to the user via user interface devices 910 (e.g., display monitor) and user interface 906. Layout editor 904 further includes conventional functionality for receiving and updating layout information (e.g., GDS II data) for the current design in layouts 908 in response to the user actions.

Although the present embodiments have been particularly described with reference to preferred ones thereof, it should be readily apparent to those of ordinary skill in the art that changes and modifications in the form and details may be made without departing from the spirit and scope of the present disclosure. It is intended that the appended claims encompass such changes and modifications.

What is claimed is:

1. A method of operating a display of a computing device, the display comprising a user interface for a circuit design tool for modifying a design of an integrated circuit, comprising:

monitoring, by the circuit design tool, movement of a cursor in a user interface of the circuit design tool that includes a display of one or more shapes in the design; and collecting, by the circuit design tool, information for the one or more shapes in response to a detected hover position of the cursor in the user interface;

displaying, by the circuit design tool, certain of the collected information in textual form;

adjusting, by the circuit design tool, one or more features of a highlight set for visualizing hierarchy information about the one or more shapes in addition to the displayed information in textual form in the user interface based on the collected information; and causing the display to be changed by causing one or more graphical highlights that visually convey the hierarchy information to be displayed together with certain of the one or more shapes in the design in the user interface for the circuit design tool based on the adjusted highlight set, while the circuit design tool is in an operational state during which the one or more shapes in the design can be edited via the user interface.

2. The method of claim 1, wherein the one or more shapes is two or more shapes, and wherein the collected information includes hierarchy information for the two or more shapes, and wherein adjusting includes creating a hierarchical highlight around two or more of the shapes.

3. The method of claim 1, wherein the collected information includes shape color information for the one or more shapes, and wherein adjusting includes setting the color of a shape highlight around a single one of the shapes to visually contrast with a color of the single shape.

4. The method of claim 1, wherein the one or more shapes is two or more shapes, and wherein the collected information includes one or both of proximity and number information for shapes surrounding a single one of the shapes, and wherein adjusting includes setting a width of a shape highlight around the single shape based on the collected information.

5. The method of claim 1, wherein the one or more shapes is two or more shapes, and wherein the collected information includes group information for the two or more shapes, and wherein adjusting includes creating a group highlight around two or more of the shapes in addition to a shape highlight around a single one of the shapes.

6. The method of claim 2, wherein the collected information further includes group information for the two or more shapes, and wherein adjusting includes creating a group highlight around a second two or more of the shapes in addition to the hierarchical highlight, the group highlight and the hierarchical highlight being visually distinguishable from each other.

7. The method of claim 2, wherein the collected information further includes shape overlap information for the two or more shapes, and wherein adjusting includes selecting a best one of two or more overlapping shapes, the hierarchical highlight being created for the best shape.

8. The method of claim 2, wherein the hierarchical highlight is created so as to outline two or more shapes that belong to the same instance in the design.

9. The method of claim 2, wherein the hierarchical highlight is created so as to outline two or more shapes that belong to the same one or more hierarchical levels in the design.

10. The method of claim 1, wherein adjusting includes dynamically adjusting the features in accordance with user preferences.

11. A computer readable storage medium having instructions stored thereon, which when executed by a computer, cause the computer to perform a method of operating a display of a computing device, the display comprising a user interface for a circuit design tool for modifying a design of an integrated circuit, the method comprising:

monitoring movement of a cursor in a user interface that includes a display of one or more shapes in the design; and collecting information for the one or more shapes in response to a detected hover position of the cursor in the user interface;

displaying certain of the collected information in textual form;

adjusting one or more features of a highlight set for visualizing hierarchy information about the one or more shapes in addition to the displayed information in textual form in the user interface based on the collected information; and causing the display to be changed by causing one or more graphical highlights that visually convey the hierarchy information to be displayed together with certain of the one or more shapes in the design in the user interface for the circuit design tool based on the adjusted highlight set, while the circuit design tool is in an operational state during which the one or more shapes in the design can be edited via the user interface.

12. The computer readable storage medium of claim 11, wherein the one or more shapes is two or more shapes, and wherein the collected information includes hierarchy information for the two or more shapes, and wherein adjusting includes creating a hierarchical highlight around two or more of the shapes.

13. The computer readable storage medium of claim 11, wherein the collected information includes shape color information for the one or more shapes, and wherein adjusting includes setting the color of a shape highlight around a single one of the shapes to visually contrast with a color of the single shape.

14. The computer readable storage medium of claim 11, wherein the one or more shapes is two or more shapes, and wherein the collected information includes one or both of proximity and number information for shapes surrounding a single one of the shapes, and wherein adjusting includes setting a width of a shape highlight around the single shape based on the collected information.

15. The computer readable storage medium of claim 12, wherein the collected information further includes group information for the two or more shapes, and wherein adjusting includes creating a group highlight around a second two or more of the shapes in addition to the hierarchical highlight, the group highlight and the hierarchical highlight being visually distinguishable from each other.

16. The computer readable storage medium of claim 12, wherein the collected information further includes shape overlap information for the two or more shapes, and wherein adjusting includes selecting a best one of two or more overlapping shapes, the hierarchical highlight being created for the best shape.

17. The computer readable storage medium of claim 12, wherein the hierarchical highlight is created so as to outline one or both of two or more shapes that belong to the same instance in the design and two or more shapes that belong to the same one or more hierarchical levels in the design.

18. The computer readable storage medium of claim 11, wherein adjusting includes dynamically adjusting the features in accordance with user preferences.

19. A system comprising:

an EDA tool comprising one or modules for interactively modifying a design of an integrated circuit comprising a plurality of layers, the EDA tool including:

a user interface that monitors movement of a cursor in a display of one or more shapes in the design; and a layout editor that collects information for the one or more shapes in response to a detected hover position of the cursor in the user interface and both displays certain of the collected information in textual form and adjusts one or more features of a highlight set for visualizing hierarchy information about the one or more shapes in addition to the displayed information in textual form in the user interface based on the collected information, wherein the layout editor is further configured to cause the display to be changed by causing one or more graphical highlights that visually convey the hierarchy information to be displayed together with certain of the one or more shapes in the design in the user interface based on the adjusted highlight set, while the EDA tool is in an operational state during which the one or more shapes in the design can be edited via the user interface.

20. The system of claim 19, wherein the one or more shapes is two or more shapes, and wherein the collected information includes hierarchy information for the two or more shapes, and wherein the layout editor adjusts the one or more features of the highlight set by creating a hierarchical highlight around two or more of the shapes.

* * * * *